(12) United States Patent
Takahashi et al.

(10) Patent No.: US 8,460,965 B2
(45) Date of Patent: Jun. 11, 2013

(54) MANUFACTURING METHOD FOR SOLAR CELL

(75) Inventors: Hirohisa Takahashi, Sammu (JP); Satoru Ishibashi, Sammu (JP); Kyuzo Nakamura, Chigasaki (JP)

(73) Assignee: ULVAC, Inc., Chigasaki-Shi (JP)

( * ) Notice: Subject to any disclaimer, the term of this patent is extended or adjusted under 35 U.S.C. 154(b) by 0 days.

(21) Appl. No.: 13/124,529

(22) PCT Filed: Oct. 15, 2009

(86) PCT No.: PCT/JP2009/005396
§ 371 (c)(1),
(2), (4) Date: Apr. 15, 2011

(87) PCT Pub. No.: WO2010/044269
PCT Pub. Date: Apr. 22, 2010

(65) Prior Publication Data
US 2011/0189817 A1    Aug. 4, 2011

(30) Foreign Application Priority Data
Oct. 17, 2008 (JP) ............... P2008-268787

(51) Int. Cl.
*H01L 21/00* (2006.01)
(52) U.S. Cl.
USPC ............................ 438/94; 216/97
(58) Field of Classification Search
USPC .................. 438/94, 753; 219/97, 99
See application file for complete search history.

(56) References Cited

U.S. PATENT DOCUMENTS

| 5,421,909 | A | 6/1995 | Ishikawa et al. | |
|---|---|---|---|---|
| 7,157,015 | B2 * | 1/2007 | Shimizu et al. | 216/24 |
| 2002/0134425 | A1 | 9/2002 | Yamamoto et al. | |
| 2006/0030152 | A1 * | 2/2006 | Yoshimura et al. | 438/689 |

FOREIGN PATENT DOCUMENTS

| CN | 1670243 | 9/2005 |
|---|---|---|
| JP | S61-278171 | 12/1986 |
| JP | H2-164077 | 6/1990 |

(Continued)

OTHER PUBLICATIONS

"Patterning." Sematech Dictionary of Semiconductor Terms. 2012. http://www.sematech.org/publications/dictionary/p_to_ph.htm. Oct. 27, 2012.*

(Continued)

*Primary Examiner* — Charles Garber
*Assistant Examiner* — Reema Patel
(74) *Attorney, Agent, or Firm* — Grossman, Tucker, Perreault & Pfleger, PLLC (57) ABSTRACT

A manufacturing method for a solar cell including an upper electrode extracting an electrode at an incident light side, the upper electrode including a transparent conductive film, a basic structural element of the transparent conductive film being any one of an indium (In), a zinc (Zn), and tin (Sn), the manufacturing method including: a step A forming a texture on a front surface of a transparent substrate using a wet etching method, the transparent conductive film being formed on the transparent substrate, wherein in the step A, when the texture is formed, a metal thin film is formed on the transparent substrate, and an anisotropic etching is performed with the metal thin film being a mask.

3 Claims, 7 Drawing Sheets

FOREIGN PATENT DOCUMENTS

| | | |
|---|---|---|
| JP | H04-53901 | 2/1992 |
| JP | H06-064939 | 3/1994 |
| JP | H11-68131 | 3/1999 |
| JP | 2001-039737 | 2/2001 |
| JP | 2003-69056 | 3/2003 |
| JP | 2003-69059 | 3/2003 |
| JP | 2003-110125 | 4/2003 |
| JP | 2008-024543 | 2/2008 |

OTHER PUBLICATIONS

International Search Report and Written Opinion dated Jan. 19, 2010 issued in PCT Patent Application No. PCT/JP2009/005396, 10 pages.

Office Action from corresponding Chinese Application No. 2009801407370 dated Sep. 29, 2012. English translation attached.

\* cited by examiner

PRIOR ART

MANUFACTURING METHOD FOR SOLAR CELL

TECHNICAL FIELD

This application claims priority to International PCT Application No. PCT/JP2009/005396 filed on Oct. 15, 2009, which claims priority to Japanese Application No. 2008-268782, filed Oct. 17, 2008, the content of which are fully incorporated herein by reference.

BACKGROUND ART

When an energy particle included in sunlight called a photon hits an i-layer, an electron and a positive hole (hole) are created due to a photovoltaic effect. As a result, the electron moves towards an n-layer, while the positive hole moves towards the p-layer. A solar cell is an element which extracts the electron, which was created by this photovoltaic effect, from an upper electrode and a back surface electrode, and converts light energy to electric energy.

Figure 10:
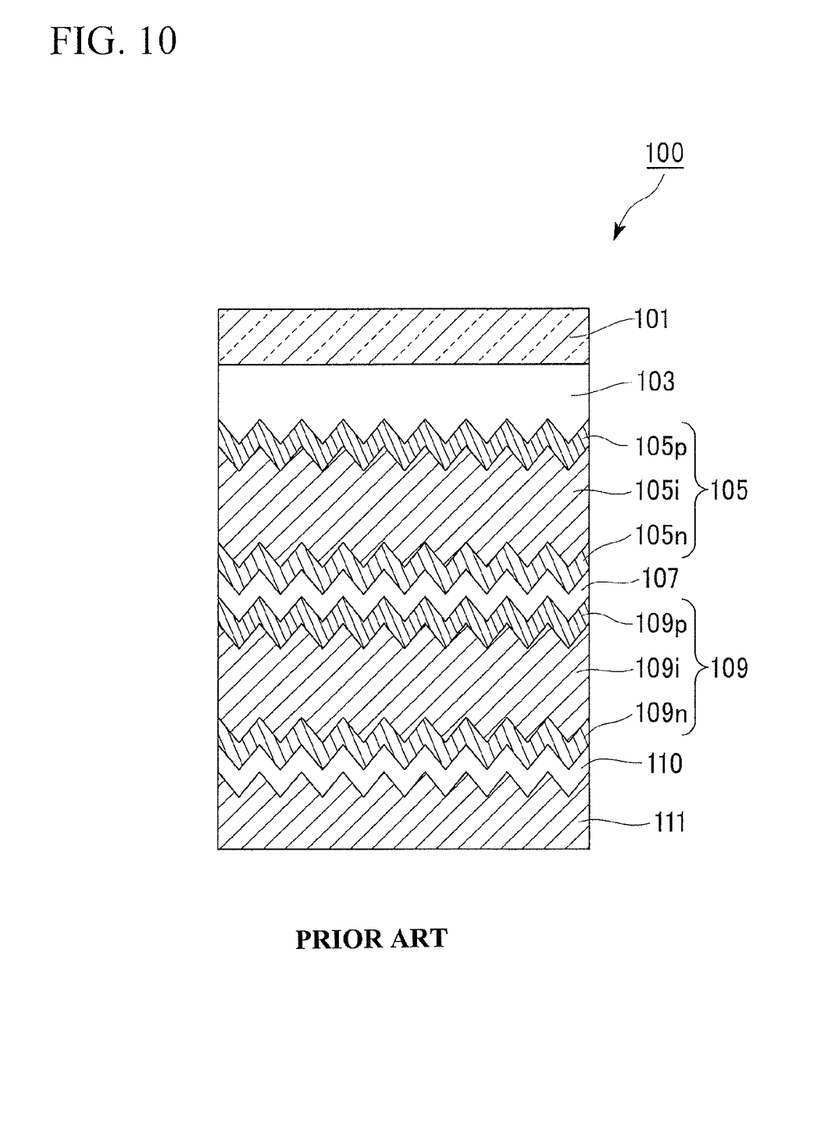
FIG. 10 is a diagram showing an example of a conventional solar cell.

FIG. 10 is a simplified cross sectional diagram of an amorphous silicon solar cell. A solar cell 100 is created by a layering of a glass substrate 101, which makes up the front surface; an upper electrode 103 comprising a zinc oxide series transparent conductive film provided on the glass substrate 101; a top cell 105 comprising an amorphous silicon; an intermediate electrode 107 comprising a transparent conductive film provided between a top cell 105 and a bottom cell 109 described later; a bottom cell 109 comprising a microcrystal silicon; a buffer layer 110 comprising a transparent conductive film; and a back surface electrode 111 comprising a metal film. (Refer to Patent Document 1, for example.)

The top cell 105 is a three-layered structure comprising a p-layer (105p), an i-layer (105i), and an n-layer (105n). Among these, the i-layer (105i) comprises amorphous silicon. In addition, similar to the top cell 105, the bottom cell 109 is also a three-layered structure comprising a p-layer (109p), an i-layer (109i), and an n-layer (109n). Among these, the i-layer (109i) comprises microcrystal silicon.

According to such a solar cell 100, the sunlight entering from the glass substrate 101 side is reflected at the back surface electrode 111 after passing through the upper electrode 103, the top cell 105 (p-i-n layer), and the buffer layer 110. Certain configurations are made to the solar cell in order to enhance the effectiveness of making a conversion to light energy by reflecting the sunlight at the back surface electrode 111, or by providing a structure called a texture on the upper electrode 101 so as to achieve a prism effect, which elongates the light path of the incident sunlight, and by achieving an effect to confine light. The buffer layer 110 is provided to prevent the dispersion of the metal film used in the back surface electrode 111. (Refer to, Patent Documents 2 and 3, for example.)

The wavelength band used for the photovoltaic effect differs depending on the device structure of the solar cell. However, at any event, it is necessary that the transparent conductive film, comprised in the upper electrode, have a characteristic such that light is passed through in order to absorb the light at the i-layer. It is also necessary that the transparent conductive film have electrical conductivity so as to extract the electron created by the photovoltaic power. As a result, an FTO, which is obtained by adding fluorine to $SnO_2$ as an impurity, as well as a ZnO series oxide semiconductor thin film are used. Similarly, it is necessary that the buffer layer have a characteristic passing through a light, which reflects at the back surface electrode in order to be absorbed by the i-layer, and a light, which was reflected by the back surface electrode. It is also necessary that the buffer layer have electrical conductivity so as to transport the positive hole to the back surface electrode.

Generally speaking, the three elements that a transparent conductive film used in a solar cell is required to have as a characteristic are electrical conductivity, optical properties, and a textured structure. First, concerning the first characteristic, electrical conductivity, a low electrical resistance is required to extract electricity which was generated. Generally speaking, the FTO, used as a transparent conductive film for solar cells, gains electrical conductivity by replacing O with F, by adding F to the $SnO_2$ at the transparent conductive film created by the CVD. Further, a ZnO series material, which is widely regarded as a post-ITO, may create a film by sputtering. Electrical conductivity is obtained by adding to ZnO, material comprising Al and Ga as well as oxygen deficiency.

Second, since a transparent conductive film for solar cells is primarily used at an incident light side, an optical property is required such that a wavelength band, absorbed by the electricity generating layer, is passed through.

Third, a textured structure is necessary to dissipate light so that sunlight is effectively absorbed by the electricity generating layer. Normally, each of the thin films of the oxidized indium series (for example, $In_2O_3$) created by a sputtering process, oxidized zinc series (for example, ZnO), or oxidized tin series (for example, $SnO_2$), have a surface condition which is too flat to disperse a wavelength region which will be absorbed by the solar cell. Therefore, it is necessary to conduct a texture forming procedure by wet etching and the like.

PRIOR ART DOCUMENT

Patent Document

[Patent Document 1] Japanese Unexamined Patent Application, First Publication No. H2-164077

[Patent Document 2] Japanese Unexamined Patent Application, First Publication No. H11-68131

[Patent Document 3] Japanese Unexamined Patent Application, First Publication No. 2003-110125

DISCLOSURE OF INVENTION

Problems to be Solved by the Invention

However, even if a method creating a texture with wet etching and the like is performed after creating each thin film of an oxidized indium series, oxidized zinc series, or oxidized tin series, there is a high tendency that the thin film will undergo an isotropic etching. Therefore, there is a problem in that this method is extremely unfit for creating a texture with a priority of having a concaved and convex shape. There is also a problem in that this method has low productivity.

Therefore, an object of the present invention is to provide a manufacturing method for a solar cell so as to enhance the productivity of forming a texture.

Means for Solving the Problems

A manufacturing method for a solar cell according to an embodiment of the present invention is a manufacturing method for a solar cell including an upper electrode extracting an electrode at an incident light side. The upper electrode includes a transparent conductive film. A basic structural element of the transparent conductive film is any one of an indium (In), a zinc (Zn), and tin (Sn). The manufacturing method according to an embodiment of the present invention includes: a step A forming a texture on a front surface of a transparent substrate using a wet etching method. The transparent conductive film is formed on the transparent substrate.

Here, in the step A, when the texture is formed, a metal thin film is formed on the transparent substrate, and an anisotropic etching is performed with the metal thin film being a mask.

In addition, the above manufacturing method for the solar cell may be configured as follows: the manufacturing method further includes a step B after the step A. In step B, while applying a sputtering voltage to a target comprising a forming ingredient of the transparent conductive film, horizontal magnetic field is generated on a front surface of the target. Thus, a sputtering is performed. In this way, the upper electrode is formed by forming the transparent conductive film on the transparent substrate. Here, the forming ingredient of the transparent conductive film includes any of an indium (In), a zinc (Zn), and tin (Sn) as a primary component.

In addition, the above manufacturing method for the solar cell may be configured as follows: the manufacturing method further includes a step B after the step A. In step B, while applying a sputtering voltage to a target comprising a forming ingredient of the transparent conductive film, horizontal magnetic field is generated on a front surface of the target. Thus, a sputtering is performed. In this way, the upper electrode is formed by forming the transparent conductive film on the transparent substrate. Here, the forming ingredient includes oxygen (O) and at least one of the indium, the zinc, and the tin as a primary component.

EFFECTS OF THE INVENTION

According to a manufacturing method for a solar cell based on the present invention, a metal thin film is formed on a transparent substrate, and an anisotropic etching is performed with this metal thin film being a mask, thereby forming a texture on a surface of the transparent substrate on which a transparent conductive film is created. As a result, a transparent conductive film is created on a transparent substrate which is provided with a texture. Thus, the texture provided on the transparent substrate is also transferred to a surface of the transparent conductive film in an automatic and reliable manner. Therefore, it is possible to significantly enhance the productivity of the texture compared to a conventional method in which a texture is formed on a transparent conductive film with a wet etching method after the transparent conductive film is created.

EMBODIMENTS FOR CARRYING OUT THE INVENTION

Hereinafter, a manufacturing method for a solar cell according to an embodiment of the present invention is described with reference to the diagrams. Incidentally, the present embodiment is described for the purpose of facilitating an understanding of the gist of the present invention. The following description does not limit the present invention in any way, unless otherwise specifically noted.

Figure 1:
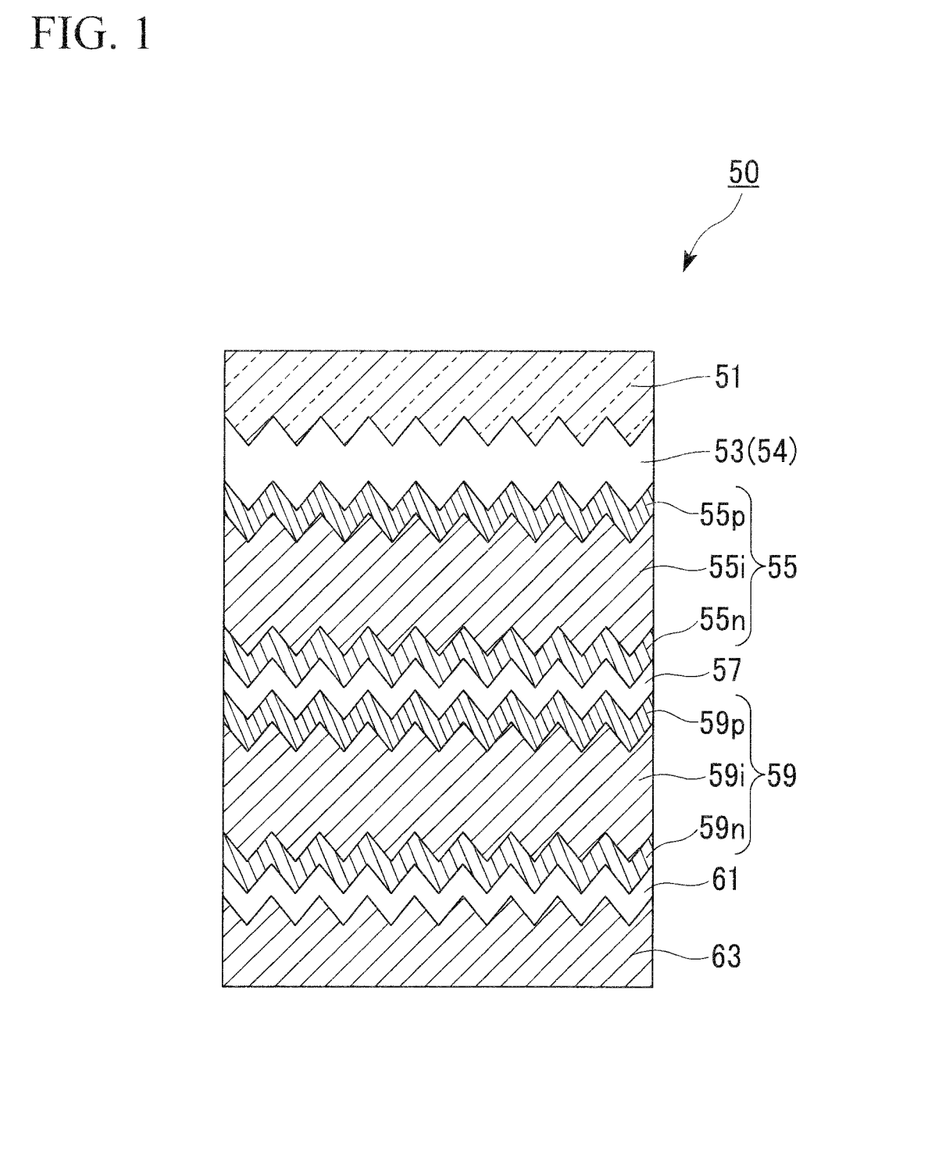
FIG. 1 is a cross sectional view showing an example of a solar cell created by a manufacturing method for a solar cell according to a first embodiment of the present invention.

First, a solar cell manufactured in the present embodiment is described according to FIG. 1. FIG. 1 is a cross sectional diagram showing an example of a configuration of a solar cell.

A solar cell 50 is created by a layering of a glass substrate 51 making up a front surface; an upper electrode 53 provided on the glass substrate 51, the upper electrode 53 comprising a transparent conductive film 54 of an oxidized indium series, oxidized zinc series, or oxidized tin series; a top cell 55 comprising an amorphous silicon (hereinafter referred to as a-Si); an intermediate electrode 57 comprising a transparent conductive film provided between the top cell 55 and a bottom cell 59 described later; a bottom cell 59 comprising microcrystal silicon (hereinafter referred to as μc-Si), a buffer layer 61 comprising a transparent conductive film; and a back surface electron 63 comprising a metal film.

In other words, the solar cell 50 is a tandem type solar cell structured by assembling a top cell 55 of the a-S1 and bottom cell 59 of the μc-Si. According to such a tandem structured solar cell 50, the effectiveness of generating electricity is enhanced by absorbing short wavelength light with the top cell 55 and by absorbing long wavelength light with the bottom cell 59. Incidentally, the film thickness of the upper electrode 53 is 2000 [Å] to 10000 [Å].

The top cell 55 is a three-layered structure comprising a p-layer (55p), an i-layer (55i), and an n-layer (55n). Among these, the i-layer (55i) comprises an amorphous silicon (a-Si). Further, similar to the top cell 55, the bottom cell 59 is a three-layered structure comprising a p-layer (59p), an i-layer (59i), and an n-layer (59n). Among these, the i-layer (59i) comprises a microcrystal silicon (μc-Si).

According to the solar cell 50 structured in this way, when an energy particle included in sunlight called a photon hits an i-layer, an electron and a positive hole (hole) are created due to a photovoltaic effect. As a result, the electron moves towards an n-layer, while the positive hole moves towards the p-layer. Light energy may be converted into electric energy by extracting the electron, which was created by this photovoltaic effect, from the upper electrode 53 and the back surface electrode 63.

Further, by providing an intermediate electrode 57 between the top cell 55 and the bottom cell 59, a part of a light, which passes through the top cell 55 and reaches the bottom cell 59, reflects at the intermediate electrode 57 and reenters from a top cell 55 side. As a result, the sensitivity characteristic of the cell increases, and the effectiveness of generating electricity is enhanced.

Furthermore, sunlight which entered from a glass substrate 51 side passes through each layer and is reflected at the back surface electrode 63. A textured structure is employed on the solar cell 50 in order to enhance the effectiveness of making a conversion to light energy by achieving a prism effect, which elongates the light path of the incident sunlight, and by achieving an effect to confine light.

Here, according to the solar cell 20 created by a manufacturing method for a solar cell according to the present invention described below, a texture is formed on a front surface of the glass substrate 51, unlike conventional transparent conductive film. This texture is created by, for example, forming a metal thin film 70 such as Cu and the like on the glass substrate 51, and by performing an anisotropic etching with this metal thin film 70 being a mask. The texture is later described in further detail.

Next, a manufacturing method for the solar cell is described.

A manufacturing method for a solar cell according to the present invention is such that an upper electrode, which acts as an electron extraction electrode at an incident light side, comprises a transparent conductive film having indium (In), zinc (Zn), or tin (Sn) as a basic structural element. This manufacturing method at least comprises a step A, in which a texture is formed on a front surface of a transparent substrate on which the transparent conductive film is formed.

According to the manufacturing method, a texture is formed on a front surface of a transparent substrate on which the transparent conductive film is formed.

Thus, by forming a transparent conductive film on a transparent substrate on which a texture is provided, the texture may be automatically transferred to the front surface of this transparent conductive film. Therefore, the productivity may be enhanced compared to a conventional method in which a texture is formed with a wet etching method after the transparent conductive film is created.

First, an example of a device (film forming device) fit for a manufacturing method for a solar cell according to the above embodiment, i.e., a sputtering device 1, is described.

Figure 2:
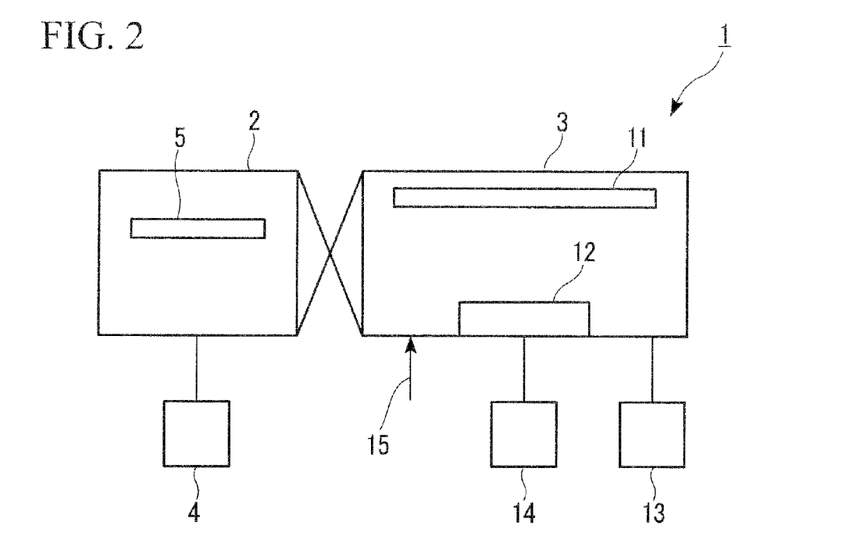
FIG. 2 is a schematic structural diagram showing an example of a film forming device fit for the manufacturing method according to the above embodiment.
Figure 3:
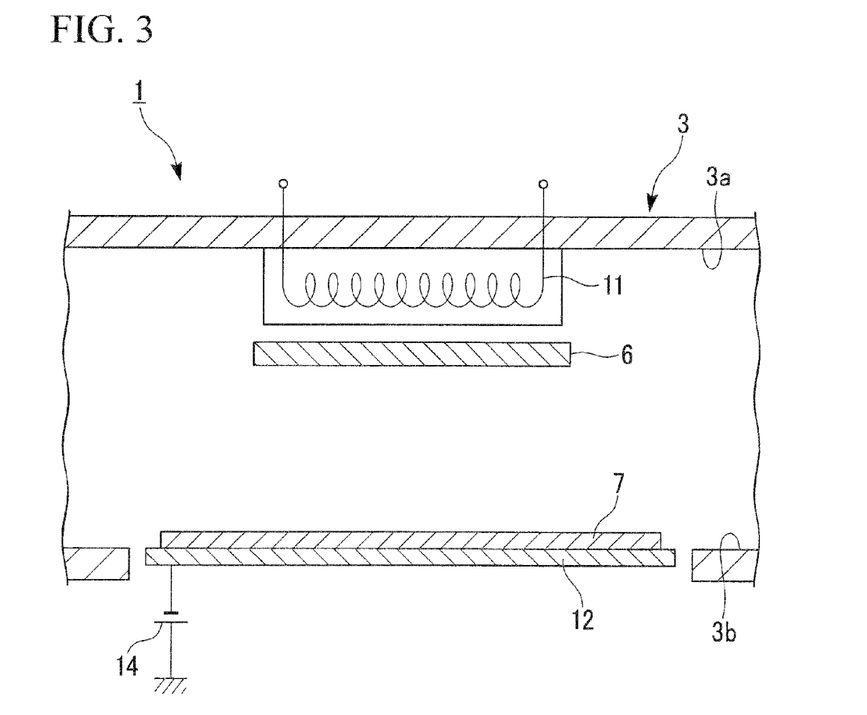
FIG. 3 is a cross sectional diagram showing a primary component of the film forming device shown in FIG. 2.

FIG. 2 is a schematic structural diagram showing an example of a sputtering device (film forming device) used in a manufacturing method for a solar cell according to the above embodiment. FIG. 3 is a cross sectional diagram showing a primary component of a film forming chamber of the sputtering device. The sputtering device 1 is an interback type. For example, the sputtering device 1 comprises a loading/ejecting chamber 2 to load/eject a substrate such as an alkali-free glass substrate (not diagrammed), and a film forming chamber (vacuum container) 3 which forms a thin film on the substrate.

The loading/ejecting chamber 2 is provided with a first exhaust unit 4 comprising rotary pump to reduce the pressure inside this chamber from atmospheric pressure (reduce coarsely). A substrate tray 5 is movably placed inside the loading/ejecting chamber 2, in order to retain/transport the substrate.

Meanwhile, a heater 11 is provided to one side surface 3a of the film forming chamber 3 in a longitudinal form to heat the substrate 6. A sputter cathode mechanism (target retaining unit) 12 is provided on another side surface 3b of the film forming chamber 3 in a longitudinal form to hold the target 7 and apply a predetermined sputter voltage. Further, a second exhaust unit 13 is provided in the film forming chamber 3. The second exhaust unit 13 comprises a turbo molecule pump and the like, which performs a high vacuuming inside the film forming chamber 3. In addition, a power source 14, which applies sputter voltage to the target 7, is provided in the film forming chamber 3. Moreover, a gas introduction unit 15 is provided inside the film forming chamber 3, which introduces process gas and the like inside the film forming chamber 3.

The sputtering cathode mechanism 12 comprises a metal plate (hereinafter referred to as a "bucking plate"), which is a planar form. This sputtering cathode mechanism 12 fixes the target 7 with a wax material and the like by bonding (fixing).

The power source 14 applies a sputtering voltage to the target 7. The sputtering voltage is obtained by superimposing a high-frequency voltage to the direct current voltage. This power source 14 comprises a direct current power source and a high-frequency voltage power source (not diagrammed).

The gas introduction unit 15 is used to introduce sputtering gas such as Ar and the like.

Figure 4:
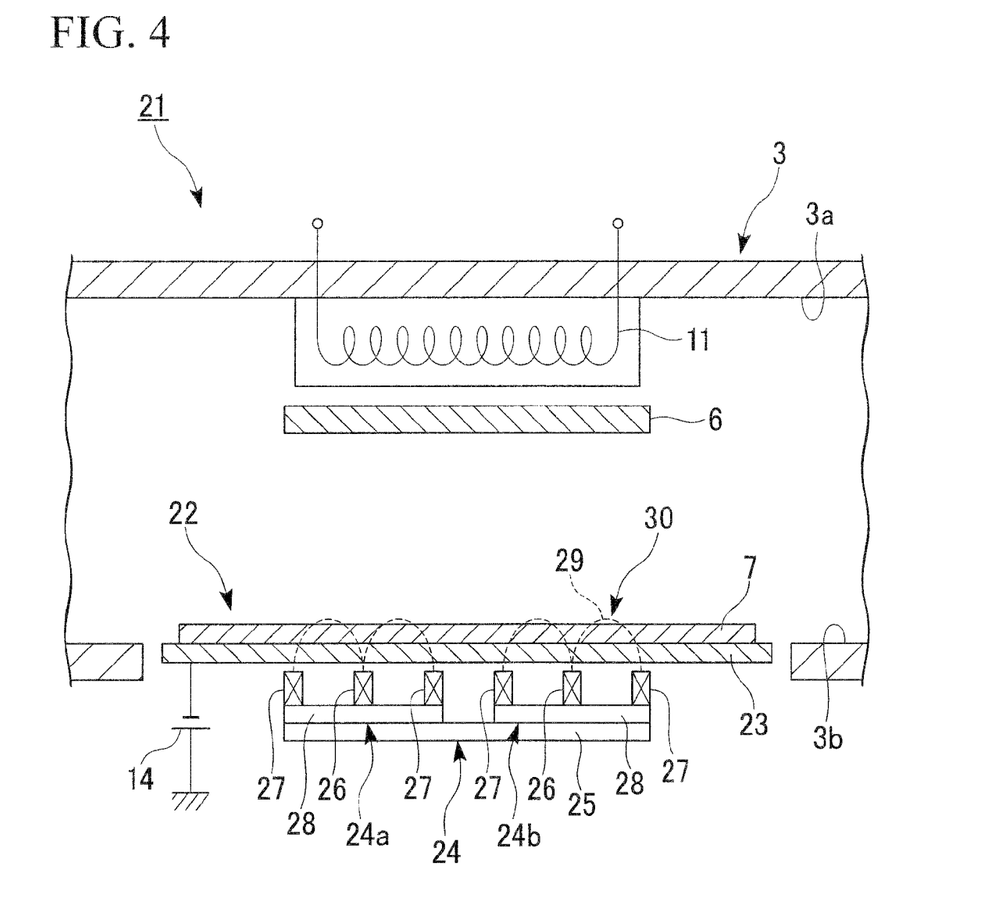
FIG. 4 is a cross sectional diagram showing another example of a film forming device fit for the manufacturing method according to the above embodiment.

Next, another example of a device (film forming device) fit for a manufacturing method for a solar cell according to the present embodiment, i.e., a magnetron sputtering device 21 of an interback type is described. FIG. 4 is a cross sectional diagram showing a primary component of a film forming of the magnetron sputtering device 21. The magnetron sputtering device 21 shown in FIG. 4 is different from the sputtering device 1 shown in FIG. 3 in that, a sputter cathode mechanism (target holding unit) 22 placed in one side surface 3a of the film forming chamber 3 comprises a magnetic circuit 24 which creates a predetermined horizontal magnetic field on a front surface of the target 7.

In other words, the sputtering cathode mechanism 22 comprises a back surface plate 23, which is bonded (fixed) to the target 7 with a wax material and the like; and also comprises a magnetic circuit 24, which is placed along a back surface of the back surface plate 23. This magnetic circuit 24 generates a horizontal magnetic field on the front surface of the target 7. According to the magnetic circuit 24, a plurality of magnetic circuit units (in FIG. 4, two units are shown) 24a, 24b are integrated by being linked together with a bracket 25. The magnetic circuit units 24a, 24b both comprise a first magnet 26 and a second magnet 27, each of which has a surface polarity at a back plate 23 side which is different from one another, and a yoke 28 which is mounted by the first magnet 26 and the second magnet 27.

According to this magnetic circuit 24, a magnetic field, represented by the magnetic field lines 29, are generated by the first magnet 26 and the second magnet 27, each of which has a surface polarity at a back plate 23 side which is different from one another. As a result, at a front surface of the target 7 between the first magnet 26 and the second magnet 27, a position 30 is generated at which a perpendicular magnetic field equals zero (i.e, a horizontal magnetic field is maximized). It is possible to increase the velocity with which the film is formed by the generation of a high-density plasma at this position 30.

According to the magnetron sputtering device 21 shown in FIG. 4, a sputtering cathode mechanism 22 is provided in a longitudinal form which generates a desired magnetic field at one side surface 3a of the film forming chamber 3. As a result, by setting the sputtering voltage to less than or equal to 340 [V], and by setting the maximum value of the strength of the horizontal magnetic field at the front surface of the target 7 to be greater than or equal to 600 [G: gauss], it is possible to form a transparent conductive film of an oxidized indium series, oxidized zinc series, or oxidized tin series having a neatly formed crystal lattice. This transparent conductive film of an oxidized indium series, oxidized zinc series, or oxidized tin series is resistant to oxidization even if an annealing treatment is conducted at a high temperature after the film is formed. Thus, it is possible to prevent an increase in specific resistance. In this way, the transparent conducting film forming the upper electrode of the solar cell may be superior in heat resistance.

Next, as an example of a manufacturing method for a solar cell according to the present embodiment, the sputtering device 1 shown in FIGS. 2, 3 is referred to in order to describe a method of forming on top of a transparent substrate (a glass substrate 50), a transparent conductive film 54 of an oxidized indium series, oxidized zinc series, or oxidized tin series, making up an upper electrode 53 of a solar cell 50.

First, a texture is formed on a front surface of a transparent substrate (a glass substrate 50) on which the transparent conductive film 54 is formed (step A).

In this step A, a wet etching method is used to from the texture.

In general, glass is used in a transparent substrate on which the transparent conductive film 54 is formed. However, it is extremely difficult to perform an anisotropic etching on an amorphous glass. In order to solve this problem, a metal thin film 70 is formed on top of the transparent substrate in the present embodiment when the texture is formed, and this metal thin film 70 is used as a mask when the anisotropic etching is performed.

Figure 5A:
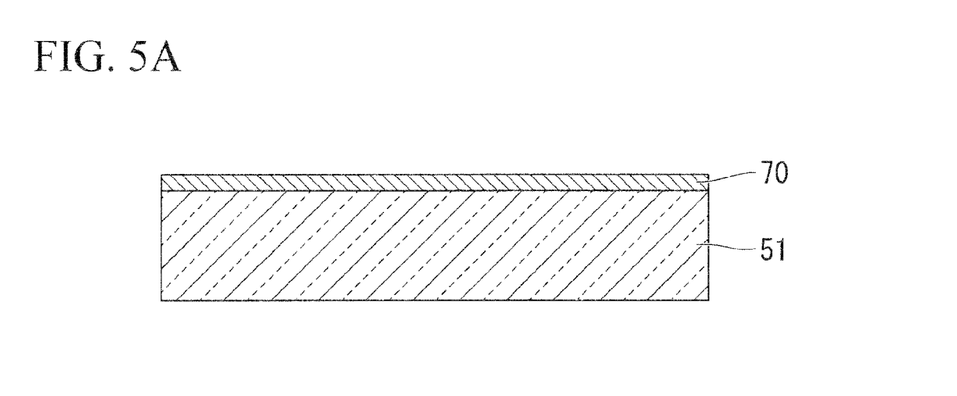
FIG. 5A is a cross sectional diagram showing a first step of a method forming a texture on a glass substrate.

In further detail, first, a sputtering voltage is applied to the target 7 comprising a metal material such as Cu and the like. The metal thin film 70 is formed on the substrate (the glass substrate 51) by performing a sputtering by generating a horizontal magnetic field on the front surface of this target [see FIG. 5A].

Figure 5B:
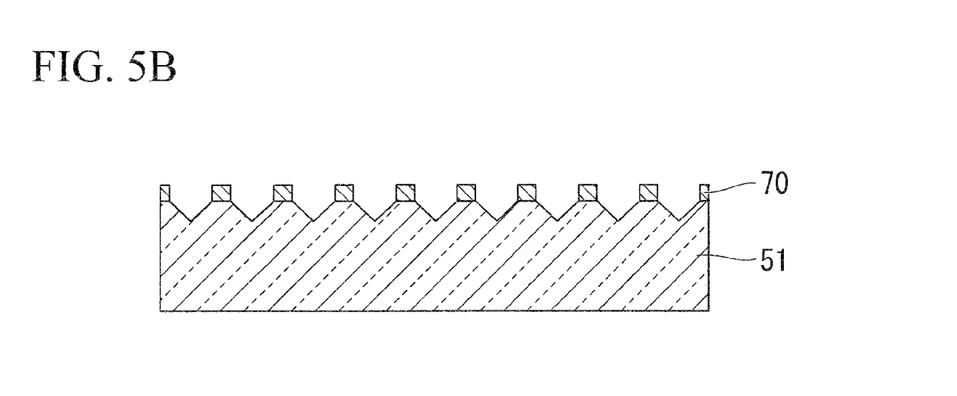
FIG. 5B is a cross sectional diagram showing a second step of a method forming a texture on a glass substrate.

Thereafter, a wet etching is performed by immersing the glass substrate on which the metal thin film 70 is formed, in an etching liquid for a predetermined amount of time [see FIG. 5B]. A 110-BHF (manufactured by Maruzen Chemicals Co., Ltd.), for instance, is used as the etching liquid.

Figure 5C:
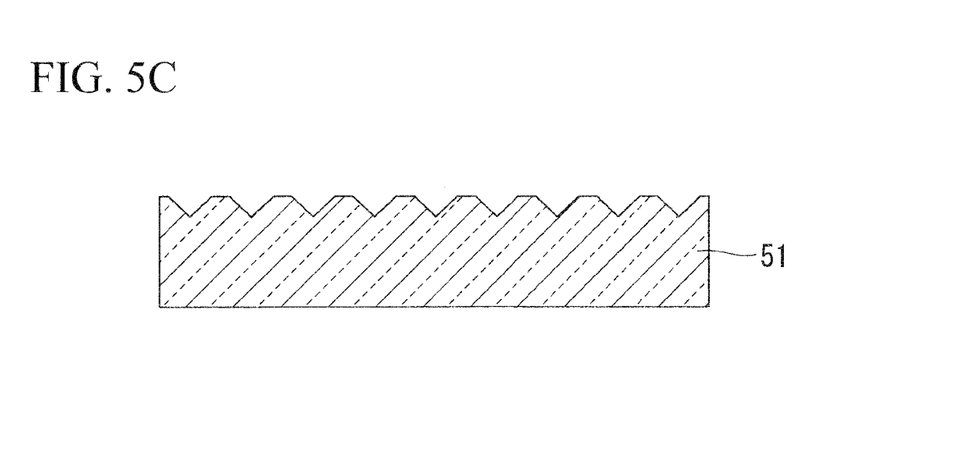
FIG. 5C is a cross sectional diagram showing a third step of a method forming a texture on a glass substrate.

Lastly, the metal thin film 70 is removed by a cleansing with nitric acid [see FIG. 5C].

As a result, a glass substrate 51 is obtained, having a texture formed on its front surface.

Next, a sputtering voltage is applied to the target 7 comprising a forming ingredient of the transparent conductive film 54. At the same time, a sputtering is performed while generating a horizontal magnetic field on the front surface of this target. In this way, the upper electrode 53 is formed by forming the transparent conductive film 54 on the substrate (the glass substrate 51) (step B).

At this time, as the forming ingredient of the transparent conductive film 54, it is favorable to use indium (In), zinc (Zn), tin (Sn), or an ingredient having these elements and oxygen (O) as a main component. An oxidized indium, oxidized zinc, or oxidized tin may be used as the target 7 itself. Alternately, oxygen may be supplied by a process gas while In, Zn, or Sn is the main component of the target 7 itself.

In addition, by using the sputtering method to form the transparent conductive film 54, it is possible to make the thickness of the film thin because it is easy to reduce the resistance of the transparent conductive film 54 which is formed. In other words, the transparent conductive film 54 which is formed has a high transparency. At the same time, the transparent conductive film 54 has a shape maintaining the textured shape of the front surface of the glass substrate 51 serving as the ground. Consequently, a prism effect by the textured structure and an effect of confining light may be adequately obtained. Accordingly, it is possible to manufacture a solar cell 50 which performs conversion in a highly effective manner.

In particular, first, the target 7 is fixed to the sputtering cathode mechanism 12 by bonding with wax material and the like. Here, as the target material, an ingredient having oxidized indium, oxidized zinc, or oxidized tin as the main component is used. Examples of the oxidized zinc (ZnO) series ingredient includes an aluminum-added oxidized zinc (AZO) obtained by adding aluminum (Al) by 0.1 to 10 [mass %], as well as a gallium-added oxidized zinc (GZO) obtained by adding gallium (Ga) by 0.1 to 10 [mass %], and the like. However, using an aluminum-added oxidized zinc (AZO) is preferable because a thin film having a low specific resistance may be formed.

Next, for example, the loading/ejecting chamber 2 and the film forming chamber 3 are roughly vacuumed at the first exhaust unit 4, in a condition in which the substrate 6 (the glass substrate 51) of the solar cell comprising glass is contained in the substrate tray of the loading/ejecting chamber 2. After the loading/ejecting chamber 2 and the film forming chamber 3 reach a predetermined degree of vacuum, for example 0.27 [Pa] (2.0 [mTorr]), the substrate 6 is transported to the film forming chamber 3 from the loading/ejecting chamber 2. Then, this substrate 6 is placed in front of the heater 11 in a condition in which the setting is turned off. Thus, the substrate 6 is made to face the target 7. Then, this substrate is heated with the heater 11 so that its temperature is in the range of 100 to 600 [° C.].

Next, the film forming chamber 3 undergoes a high vacuuming at the second exhaust unit 13. After the film forming chamber 3 reaches a predetermined degree of vacuum, for example $2.7 \times 10^{-4}$ [Pa]($2.0 \times 10^{-3}$ [mTorr]), a sputtering gas such as Ar and the like is introduced into the film forming chamber 3 by the sputtering gas introduction unit 15. Thus, the interior of the film forming chamber 3 is set to a predetermined pressure (sputtering pressure).

Next, the power source 14 applies a sputtering voltage to the target 7. For example, the sputtering voltage is obtained by superimposing a high-frequency voltage to the direct current voltage. Due to the application of the sputtering voltage, a plasma is generated on the substrate 6. Ion of the sputtering gas such as Ar and the like, which was energized by this plasma collides with the target 7. From this target 7, an element which is comprised in a material of an oxidized indium series, oxidized zinc series, or an oxidized tin series is expelled from this target 7. Thus, a transparent conductive film 54 comprising an ingredient of an oxidized indium series, oxidized zinc series, or oxidized tin series is formed on the substrate 6.

Next, this substrate 6 (glass substrate 51) is transported from the film forming chamber 3 to the loading/ejecting chamber 2. The vacuum in the loading/ejecting chamber 2 is destructed. Then, the substrate 6 (glass substrate 51), on which the transparent conductive film 54 of an oxidized indium series, oxidized zinc series, or oxidized tin series is formed, is ejected.

In this way, the substrate 6 (glass substrate 51) is obtained on which the transparent conductive film 54 of an oxidized indium series, oxidized zinc series, or oxidized tin series is formed. This transparent conductive film 54 has a shape reflecting the texture formed on the front surface of the glass substrate 51. By using such a substrate in the solar cell, it is possible to achieve, to a maximum extent, a prism effect, which elongates the light path of the incident sunlight, as well as an effect to confine light. As a result, it is possible to manufacture a solar cell which has a high incident photon-to-current conversion efficiency with high productivity.

In addition, the productivity may be enhanced by forming a texture not on the transparent conductive film 54, but on the front surface of the glass substrate 51.

In this way, a manufacturing method for a solar cell according to the present invention has been described. However, the present invention is not limited by these descriptions. Alterations may be made as appropriate as long as the gist of the present invention is not deviated.

Incidentally, in the present invention, a texture was formed on the transparent substrate comprised in the upper electrode. However, an application is possible in which an opaque glass and the like is used as the transparent substrate of the upper electrode.

Hereinafter, a working example according to the present invention is described with reference to the figures.

A texture was formed on a glass substrate (a transparent substrate) using a film forming device (a sputtering device) 1 as shown in FIGS. 2 and 3.

In particular, first, a Cu target 7 with a size of 5 inches×16 inches was attached to the sputtering cathode mechanism 12. In addition, the film forming chamber 3 was heated by adjusting the setting of the heater 11 so that the substrate temperature becomes 250 [° C.].

Thereafter, an alkali-free glass substrate (a substrate 6: without haze) is placed in the loading/ejecting chamber 2, and is transported to the film forming chamber 3 after performing an exhaust in the first exhaust unit 4. At this time, the film forming chamber 3 is maintained at a predetermined level of vacuum by the second exhaust unit 13.

Ar gas was introduced as a process gas at a pressure of 5 [mTorr] from the sputtering gas introduction unit 15. Thereafter, the Cu target attached to the sputtering cathode mechanism 12 was sputtered by applying a 1 kW of electric power to the sputtering cathode mechanism 12 by the DC power source.

These steps being a series of workflow, a Cu thin film with a thickness of 100 [Å] was formed on the alkali-free glass substrate.

Thereafter, the substrate, on which the Cu thin film was provided, was ejected into an atmospheric pressure from the loading/ejecting chamber 2.

Figure 6:
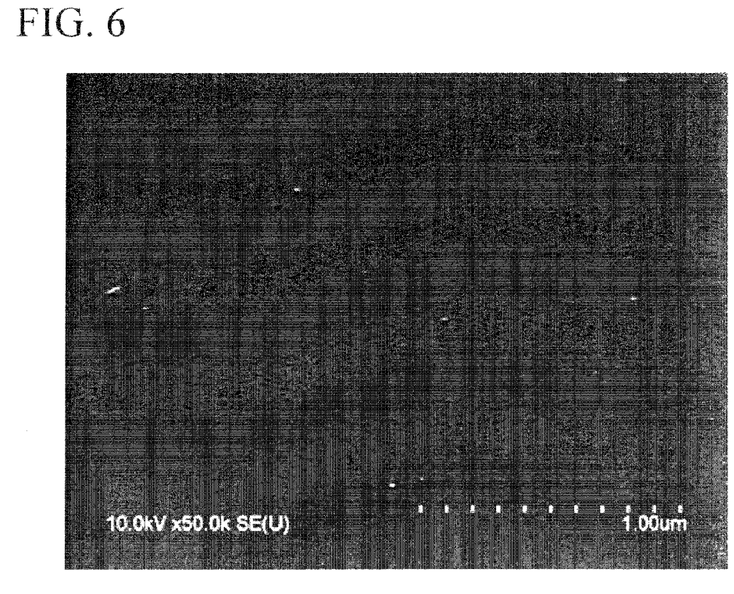
FIG. 6 shows a front surface SEM image (before etching) of a substrate on which a Cu thin film is provided.

As an initial condition, a front surface SEM image of the substrate on which the Cu thin film was provided is shown in FIG. 6.

Thereafter, the substrate on which the Cu thin film was provided was immersed in an etching liquid [110-BHF (manufactured by Maruzen Chemicals Co., Ltd.)], which is at a room temperature, for 450, 600, and 900 seconds. Thus, after performing an etching, the Cu thin film was removed by cleansing with nitric acid.

Figure 7:
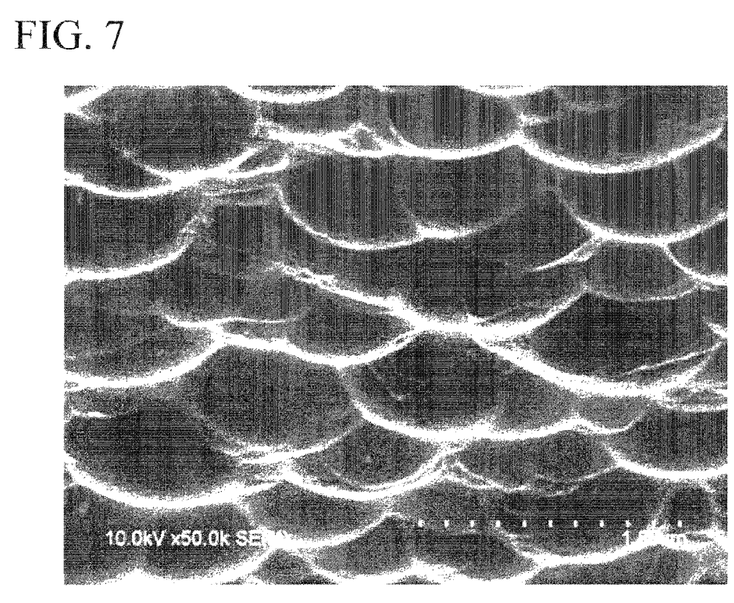
FIG. 7 shows a front surface SEM image of a substrate after etching (450 seconds after dipping).
Figure 8:
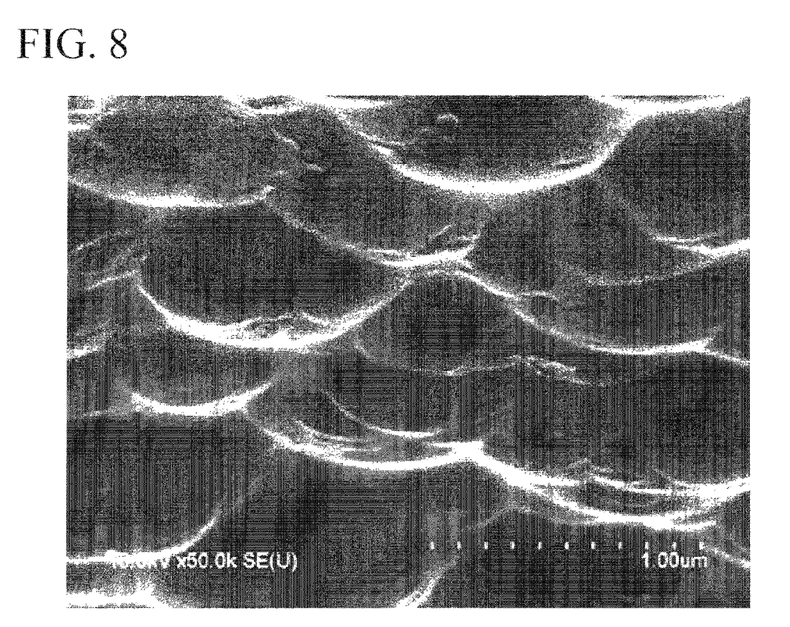
FIG. 8 shows a front surface SEM image of a substrate after etching (600 seconds after dipping).
Figure 9:
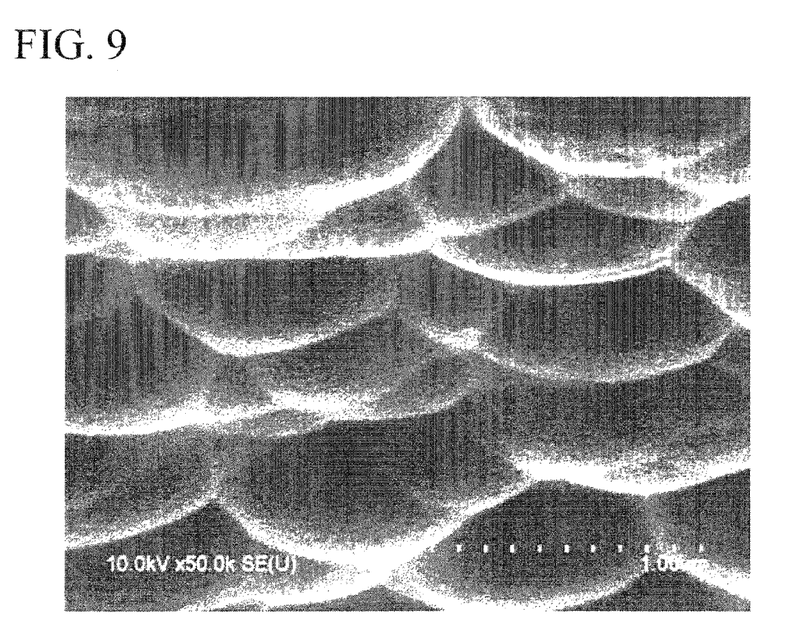
FIG. 9 shows a front surface SEM image of a substrate after etching (900 seconds after dipping).

FIG. 7 shows a front surface SEM image of the alkali-free glass substrate after an immersion time of 450 seconds (first working example). FIG. 8 shows a front surface SEM image of the alkali-free glass substrate after an immersion time of 600 seconds (second working example). FIG. 9 shows a front surface SEM image of the alkali-free glass substrate after an immersion time of 900 seconds (third working example). Comparing FIGS. 6 through 9, it may be determined that an anisotropic etching has been performed on the glass substrate which is an amorphous material.

Next, a haze meter type HR-100 manufactured by Murakami Color Research Laboratory is used to measure the haze rate of the glass substrate. The measurement results are shown in Table 1.

TABLE 1

|  | FIRST WORKING EXAMPLE | SECOND WORKING EXAMPLE | THIRD WORKING EXAMPLE |
|---|---|---|---|
| DURATION TIME OF ETCHING [SECONDS] | 450 | 600 | 900 |
| HAZING RATE [%] | 8.7 | 11.0 | 7.0 |

From Table 1, it is determined that, by performing an etching procedure on a transparent substrate (glass substrate), it is possible to form a texture which generates a haze rate on a glass substrate which does not have a haze rate (i.e., which has a haze rate that is close to zero). Generally speaking, since the haze rate of an FTO film used in a transparent conductive film for a solar cell is approximately 10[%], it is determined that, in the present invention, a haze rate which is equivalent to a haze rate of a conventional FTO film is achieved.

According to the manufacturing method based on the present invention, the texture depends on the transparent substrate (glass substrate). Thus, it is possible to form the transparent conductive film, provided on top of the transparent substrate, in a manufacturing condition which is superior in conductivity characteristics. Therefore, the present invention contributes to the further enhancement of the characteristics of solar cells.

Industrial Applicability

A manufacturing method for a solar cell according to the present invention may be widely applied to a manufacturing method of a solar cell such that an upper electrode, which acts as an electrode extracting electrons at an incident light side, includes a transparent conductive film which has indium (In), zinc (Zn), or tin (Sn) as its basic structural element.

| DESCRIPTION OF REFERENCE NUMERALS | |
|---|---|
| 50 | Solar Cell |
| 51 | Glass Substrate (Transparent Substrate) |
| 53 | Upper Electrode |
| 54 | Transparent Conductive Film |
| 54a | First Layer |
| 54b | Second Layer |
| 55 | Top Cell |
| 59 | Bottom Cell |
| 57 | Intermediate Electrode |
| 61 | Buffer Layer |
| 63 | Back Surface Electrode |

What is claimed is:

1. A manufacturing method for a solar cell comprising an upper electrode extracting an electrode at an incident light side, the upper electrode comprising a transparent conductive film, a basic structural element of the transparent conductive film being one selected from the group consisting of indium (In), zinc (Zn), and tin (Sn), the manufacturing method comprising:

forming a texture on a front surface of a transparent substrate using a wet etching method, the transparent conductive film being formed on the transparent substrate, wherein when the texture is formed, a metal thin film is formed on the transparent substrate having a substantially constant cross-sectional thickness, without patterning the metal thin film, and an anisotropic etching is performed with the metal thin film being a mask.

2. The manufacturing method for the solar cell according to claim 1, further comprising:

after forming the texture, generating a horizontal magnetic field on a front surface of the target and performing a sputtering while applying a sputtering voltage to a target comprising a forming ingredient of the transparent conductive film thereby forming the upper electrode by forming the transparent conductive film on the transparent substrate, wherein the forming ingredient of the transparent conductive film comprises one selected from the group consisting of indium (In), zinc (Zn), and tin (Sn) as a primary component.

3. The manufacturing method for the solar cell according to claim 1, further comprising:
  after forming the texture, generating a horizontal magnetic field on a front surface of the target and performing a sputtering while applying a sputtering voltage to a target comprising a forming ingredient of the transparent conductive film, thereby forming the upper electrode by forming the transparent conductive film on the transparent substrate, wherein
  the forming ingredient comprises oxygen (O) and at least one selected from the group consisting of indium, zinc, and tin as a primary component.

* * * * *